(12) United States Patent
Komoto et al.

(10) Patent No.: US 8,289,040 B2
(45) Date of Patent: Oct. 16, 2012

(54) TEST WAFER UNIT AND TEST SYSTEM

(75) Inventors: Yoshio Komoto, Gunma (JP);
Yoshiharu Umemura, Kanagawa (JP);
Shinichi Hamaguchi, Kanagawa (JP);
Yasushi Kawaguchi, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/947,721

(22) Filed: Nov. 16, 2010

(65) Prior Publication Data
US 2011/0095777 A1 Apr. 28, 2011

Related U.S. Application Data

(63) Continuation of application No. PCT/JP2008/059389, filed on May 21, 2008.

(51) Int. Cl.
*G01R 31/00* (2006.01)
(52) U.S. Cl. ......... 324/750.03; 324/754.07; 324/756.01; 324/762.02; 324/762.05
(58) Field of Classification Search .. 324/750.03–750.5, 324/754.07, 756.01, 762.02, 762.05
See application file for complete search history.

(56) References Cited

U.S. PATENT DOCUMENTS

| | | | | |
|---|---|---|---|---|
| 5,309,090 A * | 5/1994 | Lipp | | 324/750.03 |
| 6,005,401 A * | 12/1999 | Nakata et al. | | 324/756.03 |
| 6,351,134 B2 * | 2/2002 | Leas et al. | | 324/750.05 |
| 6,400,173 B1 * | 6/2002 | Shimizu et al. | | 324/754.07 |
| 6,420,884 B1 | 7/2002 | Khoury et al. | | |
| 6,871,307 B2 * | 3/2005 | Nachumovsky | | 714/718 |
| 7,183,784 B2 * | 2/2007 | Maggi et al. | | 324/750.05 |
| 2002/0075021 A1 | 6/2002 | Aldaz et al. | | |
| 2004/0012405 A1 * | 1/2004 | Cheng et al. | | 324/761 |
| 2005/0007136 A1 * | 1/2005 | Feder et al. | | 324/760 |
| 2008/0007280 A1 | 1/2008 | Amemiya et al. | | |

FOREIGN PATENT DOCUMENTS

| | | |
|---|---|---|
| JP | 7-240449 A | 9/1995 |
| JP | 2000-249722 A | 9/2000 |
| JP | 2002-222839 A | 8/2002 |
| JP | 2004-260188 A | 9/2004 |
| JP | 2007-121245 A | 5/2007 |
| JP | 2008-39768 A | 2/2008 |

OTHER PUBLICATIONS

International Search Report (ISR) issued in PCT/JP2008/059389 (parent application) mailed in Sep. 2008.
Written Opinion (PCT/ISA/237) issued in PCT/JP2008/059389 (parent application) mailed in Sep. 2008.
Japanese Office Action dated Jan. 4, 2011 in a counterpart Japanese patent application JP2010-512888. Concise Explanation of Relevance: the Japanese Office Action rejects claims in the Japanese application.
Korean Office Action date Apr. 30, 2012, in counterpart Korean patent application No. 10-2010-7023756.
Korean Office Action dated Aug. 31, 2011, in a counterpart Korean patent application No. 10-2010-7023756.

* cited by examiner

*Primary Examiner* — Arleen M Vazquez
(74) *Attorney, Agent, or Firm* — Chen Yoshimura LLP

(57) ABSTRACT

A wafer unit for testing is electrically connected to a plurality of chips to be tested formed on a wafer to be tested, the wafer unit for testing including: a connecting wafer provided to face the wafer to be tested, and to be electrically connected to each of the plurality of chips to be tested; and a temperature distribution adjusting section provided on the connecting wafer, and to adjust a temperature distribution of the wafer to be tested.

22 Claims, 13 Drawing Sheets

TEST WAFER UNIT AND TEST SYSTEM

BACKGROUND

1. Technical Field

The present invention relates to a wafer unit for testing and a test system equipped with the wafer unit for testing. In particular, the present invention relates to a wafer unit for testing, which includes a temperature distribution adjusting section for adjusting the temperature distribution of a semiconductor wafer on which a plurality of semiconductor chips are formed, and to a test system equipped with the wafer unit for testing.

2. Related Art

An apparatus is already known to conduct a test to a semiconductor wafer in which a plurality of semiconductor chips are formed to test pass/fail of each semiconductor chip (see Patent Document No. 1 for example). Such an apparatus can have a probe card that can be collectively electrically connected to a plurality of semiconductor chips. With such an apparatus, a plurality of semiconductor chips can be simultaneously tested.

Patent Document No. 1: Japanese Patent Application Publication No. 2002-222839

When a test is simultaneously conducted to a plurality of semiconductor chips, when a semiconductor chip has experienced an excessive current, the particular semiconductor chip may experience increased temperature, which tend to more or less increase the temperature of the semiconductor chips positioned near the particular semiconductor chip. This prevents the semiconductor chips near the particular semiconductor chip having caused excessive current, from being tested under the same temperature condition as that of the other semiconductor chips.

SUMMARY

Therefore, it is an object of an aspect of the innovations herein to provide a wafer unit for testing and a test system equipped with the wafer unit for testing, which are capable of overcoming the above drawbacks accompanying the related art. The above and other objects can be achieved by combinations described in the claims. A first aspect of the innovations may provide a wafer unit for testing that is electrically connected to a plurality of chips to be tested formed on a wafer to be tested, the wafer unit for testing including: a connecting wafer provided to face the wafer to be tested, and to be electrically connected to each of the plurality of chips to be tested; and a temperature distribution adjusting section provided on the connecting wafer, and to adjust a temperature distribution of the wafer to be tested.

A second aspect of the innovations may provide a test system for testing a plurality of chips to be tested formed on a wafer to be tested, the test system including: a wafer unit for testing that is electrically connected to the plurality of chips to be tested; and a control apparatus that tests each of the plurality of chips to be tested via the wafer unit for testing, where the wafer unit for testing includes: a connecting wafer provided to face the wafer to be tested, and to be electrically connected to each of the plurality of chips to be tested; and a temperature distribution adjusting section provided for the connecting wafer, and to adjust a temperature distribution of the wafer to be tested.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
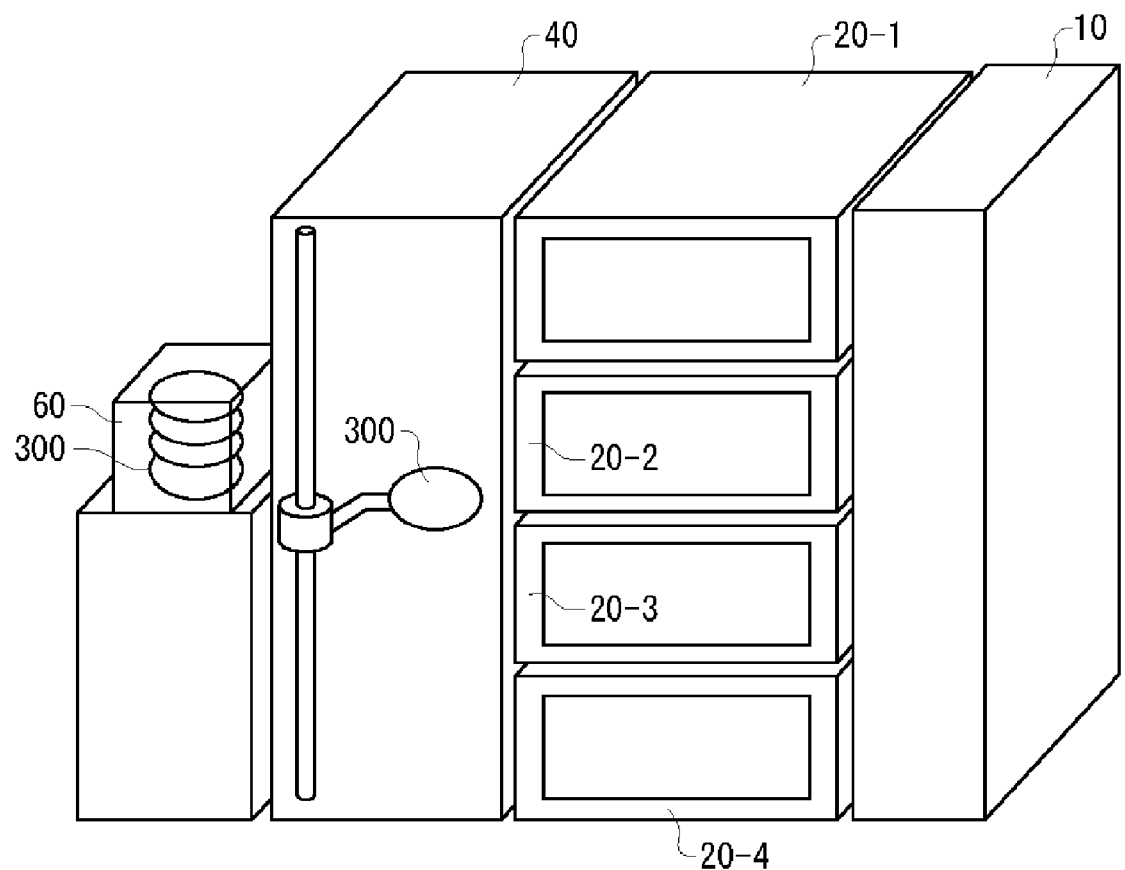
FIG. 1 shows an overview of a test system 400 according to one embodiment of the present invention.

FIG. 1 shows an overview of a test system 400 according to one embodiment of the present invention. The test system 400 tests a plurality of semiconductor chips (hereinafter referred to as "chips to be tested") formed on a wafer to be tested 300. The test system 400 may test a plurality of wafers to be tested 300 in parallel. The test system 400 includes a control apparatus 10, a plurality of chambers 20 (20-1, 20-2, 20-3, 20-4), a conveyance apparatus 40, and a wafer cassette 60.

The control apparatus 10 controls the test system 400. The control apparatus 10 may control the chamber 20, the conveyance apparatus 40, and the wafer cassette 60. The plurality of chambers 20 sequentially receive the wafers to be tested 300 and test them inside. Each chamber 20 may test a wafer to be tested 300 independently from one another. In other words, each chamber 20 may test a wafer to be tested 300 without synchronizing with the other chambers 20.

The wafer cassette 60 stores the plurality of wafers to be tested 300. The conveyance apparatus 40 conveys each wafer to be tested 300 from the wafer cassette 60 to any of empty chambers 20. The conveyance apparatus 40 may also take out, from the chamber 20, a wafer to be tested 300 having finished a test, and store it to the wafer cassette 60.

Figure 2:
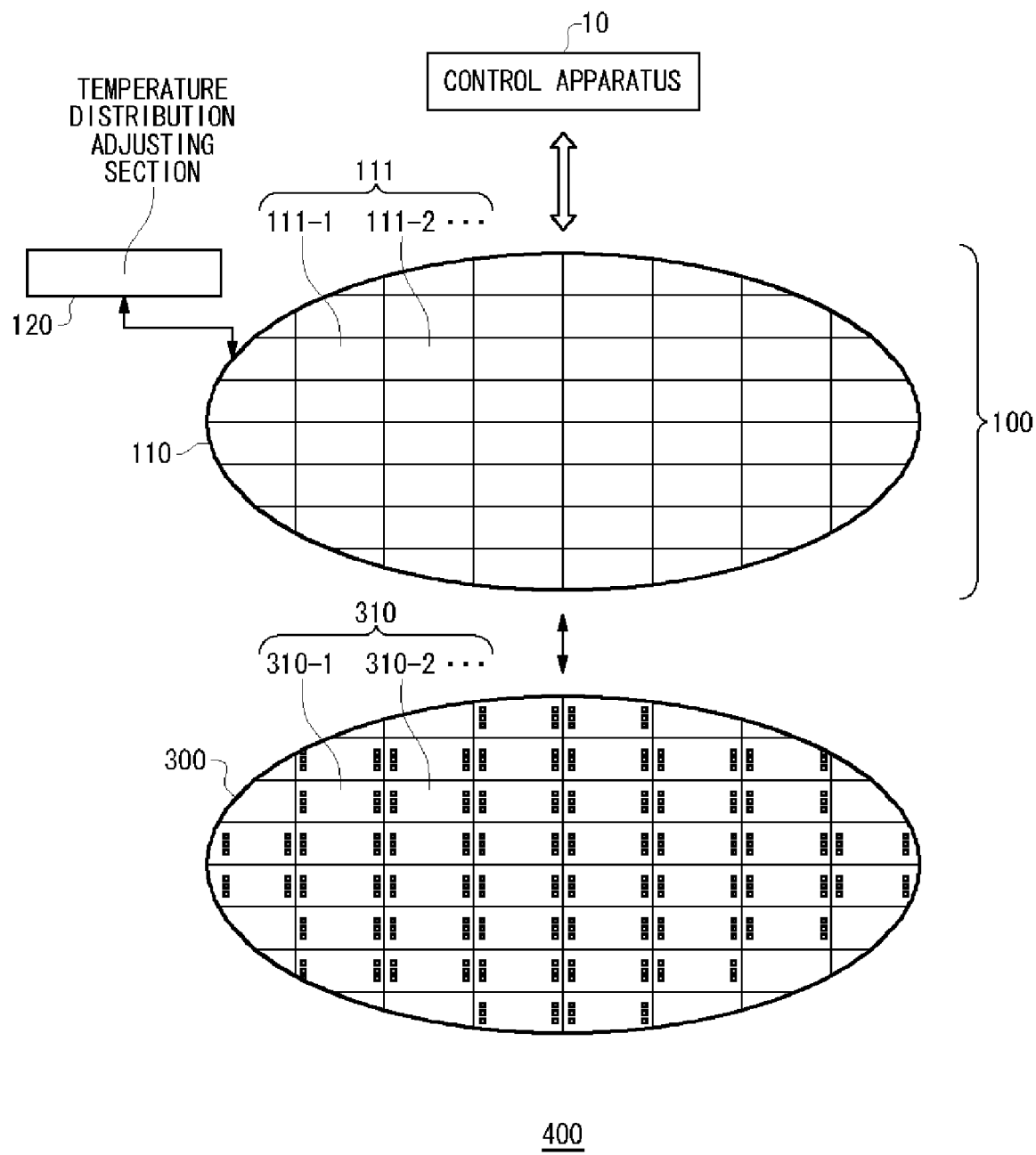
FIG. 2 shows an overview of an exemplary configuration of a test system 400 according to one embodiment of the present invention.

FIG. 2 shows an overview of an exemplary configuration of a test system 400 according to one embodiment of the present invention. The test system 400 according to the present embodiment tests a wafer to be tested 300 on which a plurality of chips to be tested 310 (310-1, 310-2, . . . ) are formed, for example as shown in FIG. 2. The plurality of chips to be tested 310 may be formed onto the wafer to be tested 300, by means of a semiconductor process such as exposure.

The wafer unit for testing 100 includes a connecting wafer 110 and a temperature distribution adjusting section 120. The connecting wafer 110 is provided to face the wafer to be tested 300. The connecting wafer 110 has a plurality of unit cells 111 (111-1, 111-2, . . . ) provided in position corresponding to the plurality of chips to be tested 310 provided on the wafer to be tested 300. Accordingly, when for example the wafer unit for testing 100 is electrically connected to the wafer to be tested 300 in the later-detailed probe apparatus 200 provided in the chamber 20 of the test system 400, the terminal of the unit cell 111-1 of the connecting wafer 110 will be electrically connected to the pad of the chip to be tested 310-1 in the wafer to be tested 300.

The control apparatus 10 tests each chip to be tested 310 of the wafer to be tested 300, via the connecting wafer 110. The control apparatus 10 may supply a test signal to each chip to be tested 310 via the wafer unit for testing 100. The control apparatus 10 may also receive, via the wafer unit for testing 100, a response signal that each chip to be tested 310 outputs in response to a test signal, and judge pass/fail of the chip to be tested 310.

The temperature distribution adjusting section 120 adjusts the temperature distribution of the wafer to be tested 300. Specifically, when the later-detailed probe apparatus 200 tests pass/fail of the plurality of chips to be tested 310 of the wafer to be tested 300, the temperature distribution adjusting section 120 detects the local change in temperature of the wafer to be tested 300 caused due to excessive current or current interruption or the like of a particular chip to be tested 310 for example, and adjusts the temperature distribution of the wafer to be tested 300 to alleviate the local change in temperature.

Although shown in FIG. 2 to be separate from the connecting wafer 110 in FIG. 2, the temperature distribution adjusting section 120 may be provided in the connecting wafer 110. The temperature distribution adjusting section 120 may be the later-detailed individual temperature adjusting sections 121 provided in correspondence with a plurality of chips to be tested 310, or may be a control circuit for controlling each individual temperature adjusting section 121. The temperature distribution adjusting section 120 may be patterned onto the connecting wafer 110 by means of etching or the like.

Figure 3:
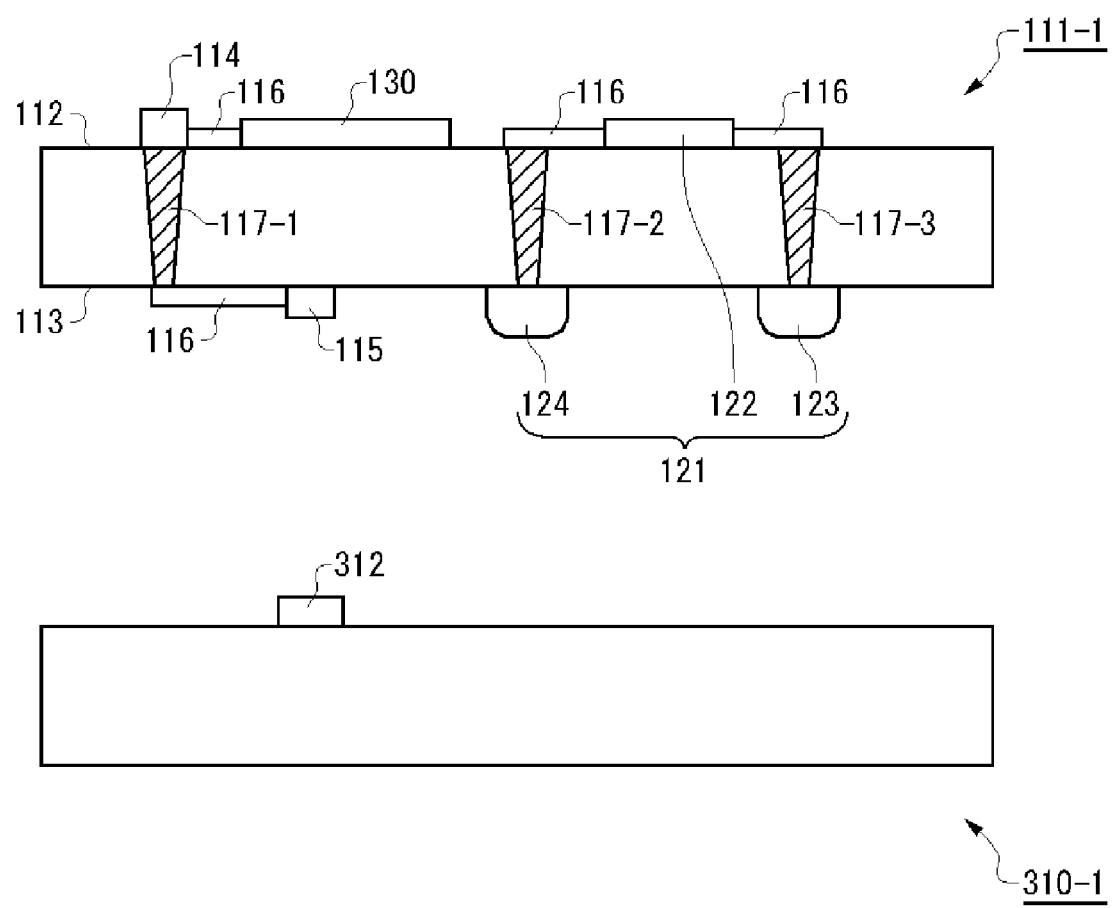
FIG. 3 is an exemplary sectional view of a unit cell 111-1 of a connecting wafer 110 and a chip to be tested 310-1 of a wafer to be tested 300.

FIG. 3 is an exemplary sectional view of a unit cell 111-1 of a connecting wafer 110 and a chip to be tested 310-1 of a wafer to be tested 300. FIG. 3 illustrates only the unit cell 111-1 of the connecting wafer 110 as well as the chip to be tested 310-1 of the wafer to be tested 300 that faces the unit cell 111-1, without showing the other unit cells 111 having the same configuration as that of the unit cell 111-1 of the connecting wafer 110 in FIG. 3. Also the chips to be tested 310 other than the chip to be tested 310-1 are also not shown because of their similarity in configuration to the chip to be tested 310-1.

The unit cell 111-1 includes an individual temperature adjusting section 121 and a test circuit 130. The individual temperature adjusting section 121 includes a control circuit 122, a heater 123, and a temperature sensor 124. The control circuit 122 and the test circuit 130 are provided on a surface (hereinafter referred to as "upper surface 112 of the unit cell 111-1") of the unit cell 111-1 that faces away from the chip to be tested 310. The heater 123 is provided on a surface (hereinafter referred to as "lower surface 113 of the unit cell 111-1") of the unit cell 111-1 that faces the chip to be tested 310-1.

An apparatus pad 114 is provided on the upper surface 112 of the unit cell 111-1. A pad for wafer to be tested 115 is provided on the lower surface 113 of the unit cell 111-1, in a position corresponding to the terminal 312 provided on the upper surface of the chip to be tested 310-1. Furthermore, a plurality of vias 117 (117-1, 117-2, 117-3) are provided through the unit cell 111-1 from the upper surface 112 to the lower surface 113.

The control circuit 122 is electrically connected to a heater 123, via the pattern wire 116 and the via 117-3. The control circuit 122 is also electrically connected to a temperature sensor 124 via the pattern wire 116 and the via 117-2.

The test circuit 130 is electrically connected to the apparatus pad 114 via the pattern wire 116. The test circuit 130 is also electrically connected to the pad for wafer to be tested 115 provided on the lower surface 113 of the unit cell 111-1, via the apparatus pad 114, the via 117-1 provided through the unit cell 111-1, and the pattern wire 116.

When testing the wafer to be tested 300, the pad for wafer to be tested 115 comes near to the terminal 312. Moreover, the tip of the heater 123 and the tip of the temperature sensor 124 come near to the upper surface of the chip to be tested 310-1. According to this configuration, the test system 400 tests the plurality of chips, including the chip to be tested 310-1.

The test circuit 130 sends a predetermined test signal to the chip to be tested 310-1 via the terminal 312, and receives a response signal from the chip to be tested 310-1 via the terminal 312. Here, the control circuit 122 of the individual temperature adjusting section 121 detects information corresponding to the power consumption of the chip to be tested 310-1, via the terminal 312 of the chip to be tested 310-1. In this example, the control circuit 122 may detect the surface temperature of the chip to be tested 310-1, which has been measured by the temperature sensor 124.

The control circuit 122 then controls the heater 123 based on the detected surface temperature of the chip to be tested 310-1. For example, when the detected surface temperature of the chip to be tested 310-1 is lower than a predetermined temperature, the control circuit 122 heats the chip to be tested 310-1 using the heater 123 until the temperature of the chip to be tested 310-1 gets higher than the predetermined temperature. Here, the predetermined temperature may be a reference value of a temperature reached by heat generation of the chip to be tested 310, being a good product, during a test due to the current or the like, or may be a lower limit of the management width determined based on the reference value.

Figure 4:
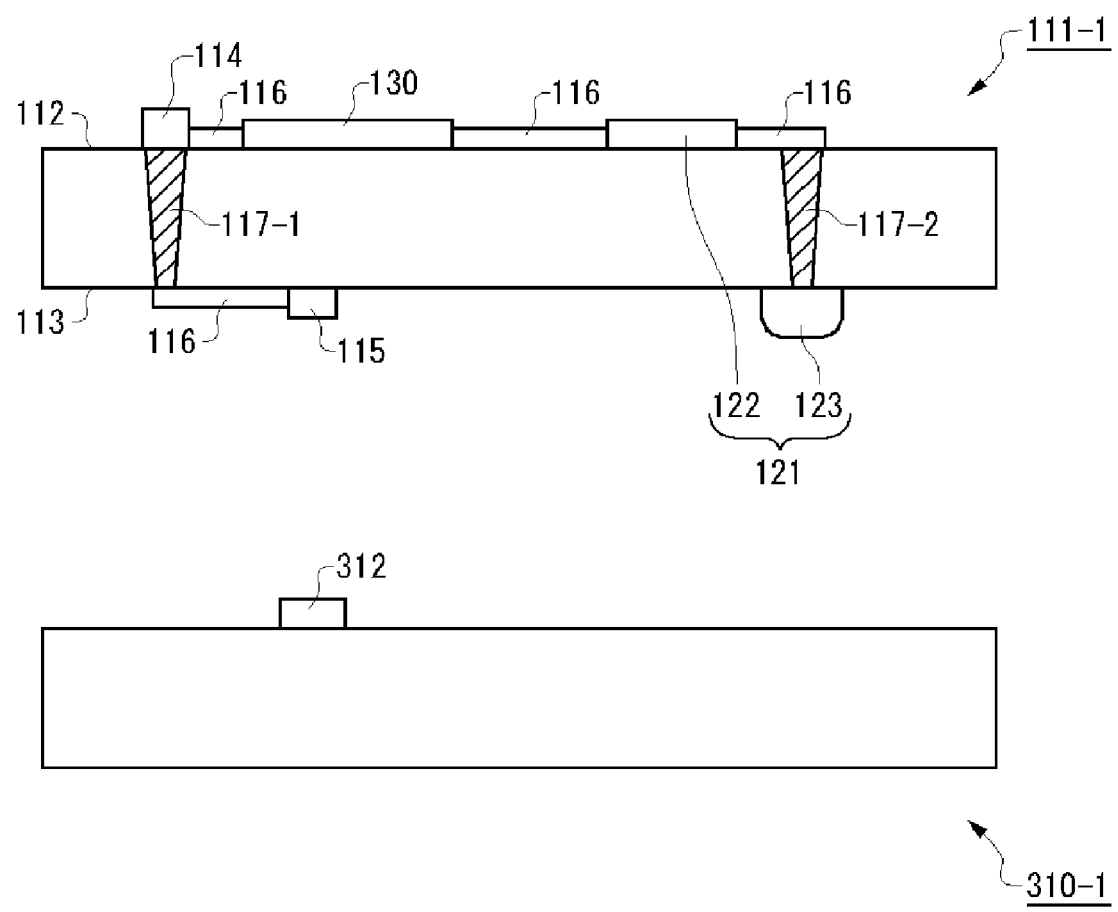
FIG. 4 is another exemplary sectional view of a unit cell 111-1 of a connecting wafer 110 and a chip to be tested 310-1 of a wafer to be tested 300.

FIG. 4 is another exemplary sectional view of a unit cell 111-1 of a connecting wafer 110 and a chip to be tested 310-1 of a wafer to be tested 300. The present example is different from the example explained above with reference to FIG. 3 in that the control circuit 122 is electrically connected to the heater 123 and the test circuit 130.

In the present example, the control circuit 122 detects the consumption current of the chip to be tested 310-1 during a test, based on the value of the current flowing through the test circuit 130. The control circuit 122 controls the heater 123 based on the size of the detected consumption current.

Specifically, when the detected consumption current is smaller than a predetermined value, the control circuit 122 heats the chip to be tested 310-1 using the heater 123. Specifically, when a chip to be tested 310, being a good product, is heated up to a predetermined temperature by means of the current flowing in the chip to be tested 310, the control circuit 122 heats a chip to be tested 310-1 experiencing current interruption by means of the heater 123 until it becomes substantially the predetermined temperature.

When the detected surface temperature is higher than a predetermined value, the control circuit 122 may adjust the current to be supplied to the chip to be tested 310-1. Specifically, by reducing the current to be supplied to the chip to be tested 310-1, the size of the current to be flown to the chip to be tested 310-1 can be adjusted to a level that is substantially the same as or smaller than the size of the current detected from the chip to be tested being a good product. The control circuit 122 may output a signal signaling the control apparatus 10 to reduce the current to be supplied to the chip to be tested 310-1, or output such a signal to the test circuit 130.

Figure 5:
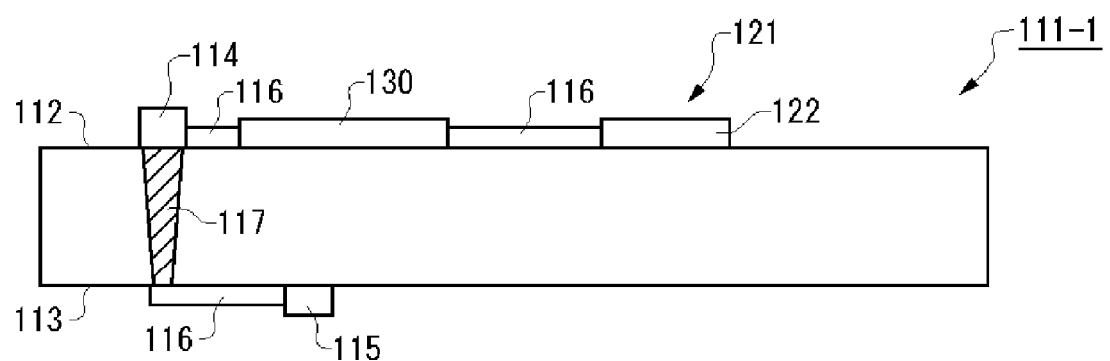
FIG. 5 is another exemplary sectional view of a unit cell 111-1 of a connecting wafer 110 and a chip to be tested 310-1 of a wafer to be tested 300.
Figure 5:
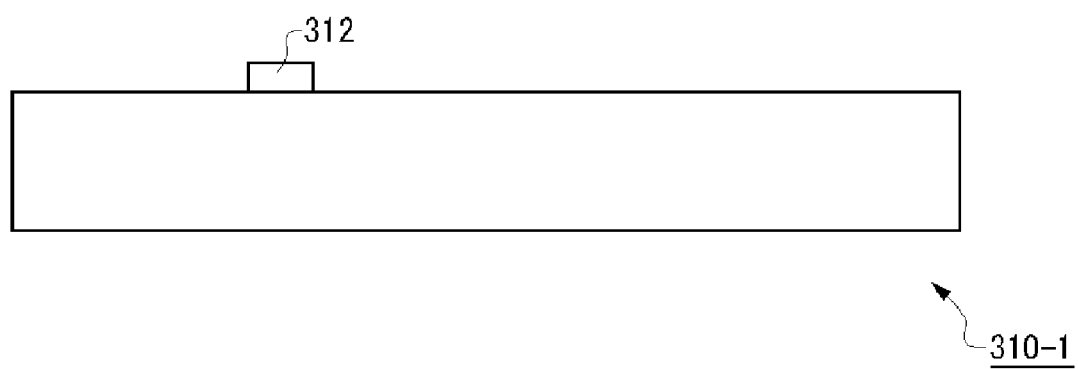

FIG. 5 is another exemplary sectional view of a unit cell 111-1 of a connecting wafer 110 and a chip to be tested 310-1 of a wafer to be tested 300. The present example is different from each of the examples explained above with reference to FIG. 3 and FIG. 4, in that the individual temperature adjusting section 121 does not include a heater 123 or a temperature sensor 124.

In the present example, the control circuit 122 detects the consumption current of the chip to be tested 310-1 during a test, based on the value of the current flowing through the test circuit 130. Then the control circuit 122 adjusts the current to be supplied to the chip to be tested 310, based on the size of the detected consumption current.

Specifically, when the detected consumption current is smaller than a predetermined value, the control circuit 122 increases the current to be supplied to the chip to be tested 310, to adjust the size of the current flowing to the chip to be tested 310 to a level that is substantially the same as the size of the current detected from the chip to be tested being a good product. When the detected consumption current is larger than a predetermined value, the control circuit 122 decreases the current to be supplied to the chip to be tested 310, to adjust the size of the current flowing to the chip to be tested 310 to a level that is substantially the same as the size of the current detected from the chip to be tested being a good product.

Note that the control circuit 122 may output a signal signaling the control apparatus 10 to adjust the current to be supplied to the chip to be tested 310, or output such a signal to the test circuit 130.

In this way, the individual temperature adjusting section 121 adjusts the surface temperature of the chip to be tested 310-1 or the current to be supplied to the chip to be tested 310-1, so that the temperature of the chip to be tested 310-1 becomes substantially equal to the temperature of the chip to be tested being a good product, even when the chip to be tested 310-1 has caused excessive current or current interruption during a test attributable to the fact that the chip to be tested 310-1 is a bad product or the like. For the other chips to be tested 310 of the wafer to be tested 300 including the chip to be tested 310-1, the corresponding individual temperature adjusting sections will perform the temperature adjustment, just as the temperature adjustment performed by the individual temperature adjusting section 121.

Therefore, even when excessive current or current interruption has caused during a test on a plurality of chips to be tested 310 near each chip to be tested 310 of the wafer to be tested 300, the particular chip to be tested 310 can be tested with little effect from the temperature change. This improves the accuracy of the test of each chip to be tested 310.

Figure 6:
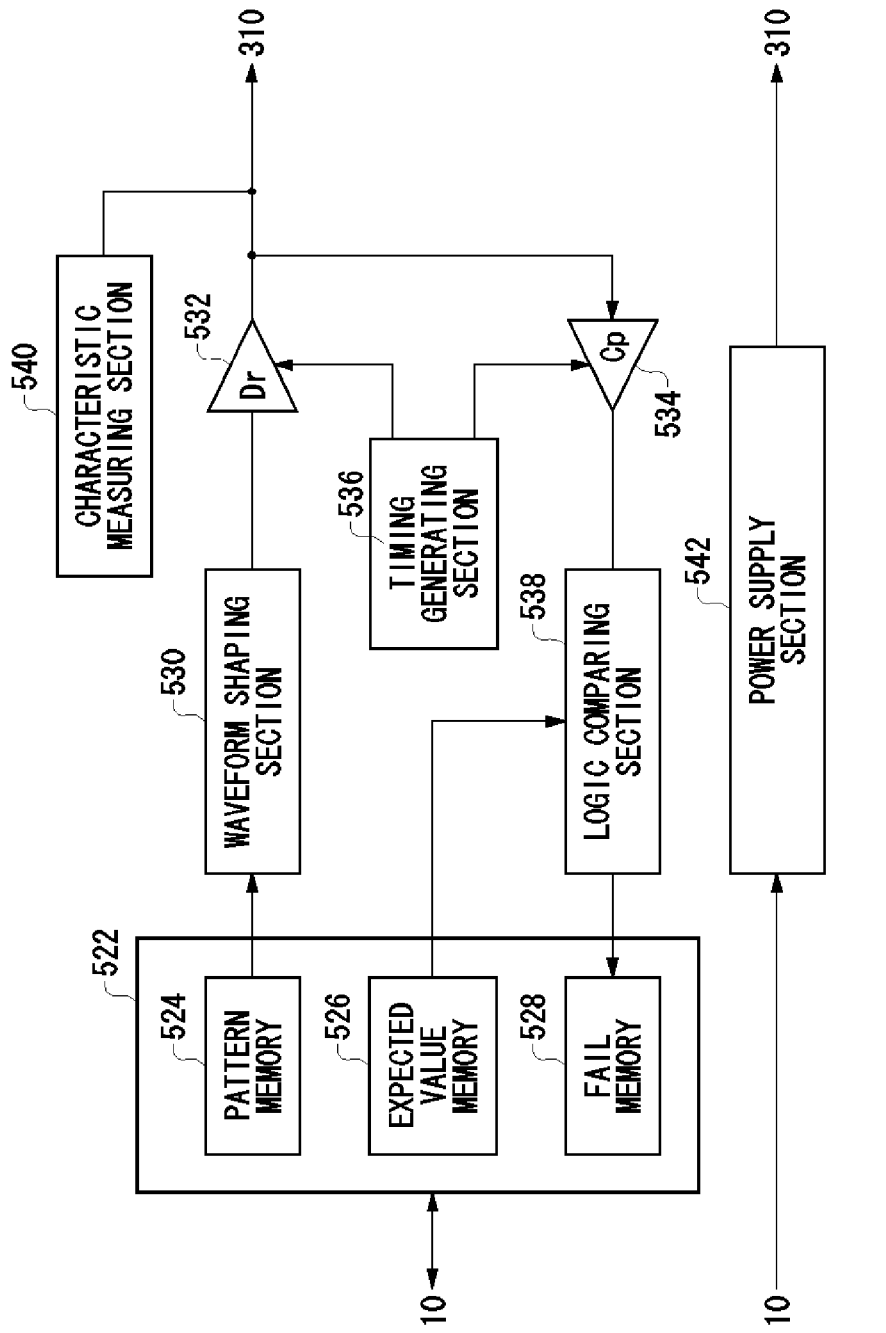
FIG. 6 is a block diagram showing an exemplary functional configuration of a test circuit 130.

FIG. 6 is a block diagram showing an exemplary functional configuration of a test circuit 130. The test circuit 130 includes a pattern generating section 522, a waveform shaping section 530, a driver 532, a comparator 534, a timing generating section 536, a logic comparing section 538, a characteristic measuring section 540, and a power supply section 542. Note that the test circuit 130 may have the configuration of FIG. 6 for each input/output pin of the chip to be tested 310 connected thereto. The explained configurations may be formed on the circuit wafer 110 by a semiconductor process such as exposure.

The pattern generating section 522 generates a logic pattern of a test signal. The pattern generating section 522 of the present example includes a pattern memory 524, an expected value memory 526, and a fail memory 528. The pattern generating section 522 may output a logic pattern pre-stored in the pattern memory 524. The pattern memory 524 may store a logic pattern supplied from the control apparatus 10 prior to starting of a test. The pattern generating section 522 may also generate the logic pattern based on an algorithm supplied in advance.

The waveform shaping section 530 shapes the waveform of a test signal based on the logic pattern supplied from the pattern generating section 522. The waveform shaping section 530 may shape the waveform of a test signal by outputting the voltage corresponding to each logical value of a logic pattern in each predetermined bit period.

The driver 532 outputs a test signal corresponding to the waveform supplied from the waveform shaping section 530. The driver 532 may output a test signal according to the timing signal supplied from the timing generating section 536. For example, the driver 532 may output a test signal having the same period as that of the timing signal. The test signal outputted from the driver 532 is supplied to the corresponding chip to be tested 310 via a pad for wafer to be tested 115 or the like.

The comparator 534 measures a response signal outputted from the chip to be tested 310. The comparator 534 may measure the logic pattern of the response signal, by sequentially detecting the logical value of the response signal according to the strobe signal supplied from the timing generating section 536.

The logic comparing section 538 functions as a judgment section that judges pass/fail of a corresponding chip to be tested 310 based on the logic pattern of the response signal measured by the comparator 534. The logic comparing section 538 may judge pass/fail of the chip to be tested 310, based on the judgment as to whether the expected value pattern supplied from the pattern generating section 522 matches the logic pattern detected by the comparator 534. The pattern generating section 522 may supply, to the logic comparing section 538, the expected value pattern stored in advance in the expected value memory 526. The expected value memory 526 may store the logic pattern supplied from the control apparatus 10 prior to starting of a test. The pattern generating section 522 may alternatively generate the expected value pattern based on an algorithm supplied in advance.

The fail memory 528 stores the comparison result of the logic comparing section 538. When a memory region of the chip to be tested 310 is tested, the fail memory 528 may store the pass/fail judgment result of the logic comparing section 538 for each address of the chip to be tested 310. The control apparatus 10 may read the pass/fail judgment result stored in the fail memory 528. The apparatus pad 114 may output the pass/fail judgment result stored in the fail memory 528, to the control apparatus 10 outside the wafer unit for testing 100.

The characteristic measuring section 540 measures the waveform of the current or the voltage outputted from the driver 532. The characteristic measuring section 540 may function as a judgment section that judges pass/fail of the chip to be tested 310, based on the judgment as to whether the waveform of the voltage or the current supplied from the driver 532 to the chip to be tested 310 satisfies a predetermined specification.

The power supply section 542 supplies the source power for driving the chip to be tested 310. The power supply section 542 may supply, to the chip to be tested 310, the source power corresponding to the power supplied from the control apparatus 10 during a test. The power supply section 542 may also supply a driving power to each constituting element of the test circuit 130.

According to the stated configuration of the test circuit 130, a test system can reduce the size of the control apparatus 10. An exemplary control apparatus 10 is a general-purpose personal computer.

Figure 7:
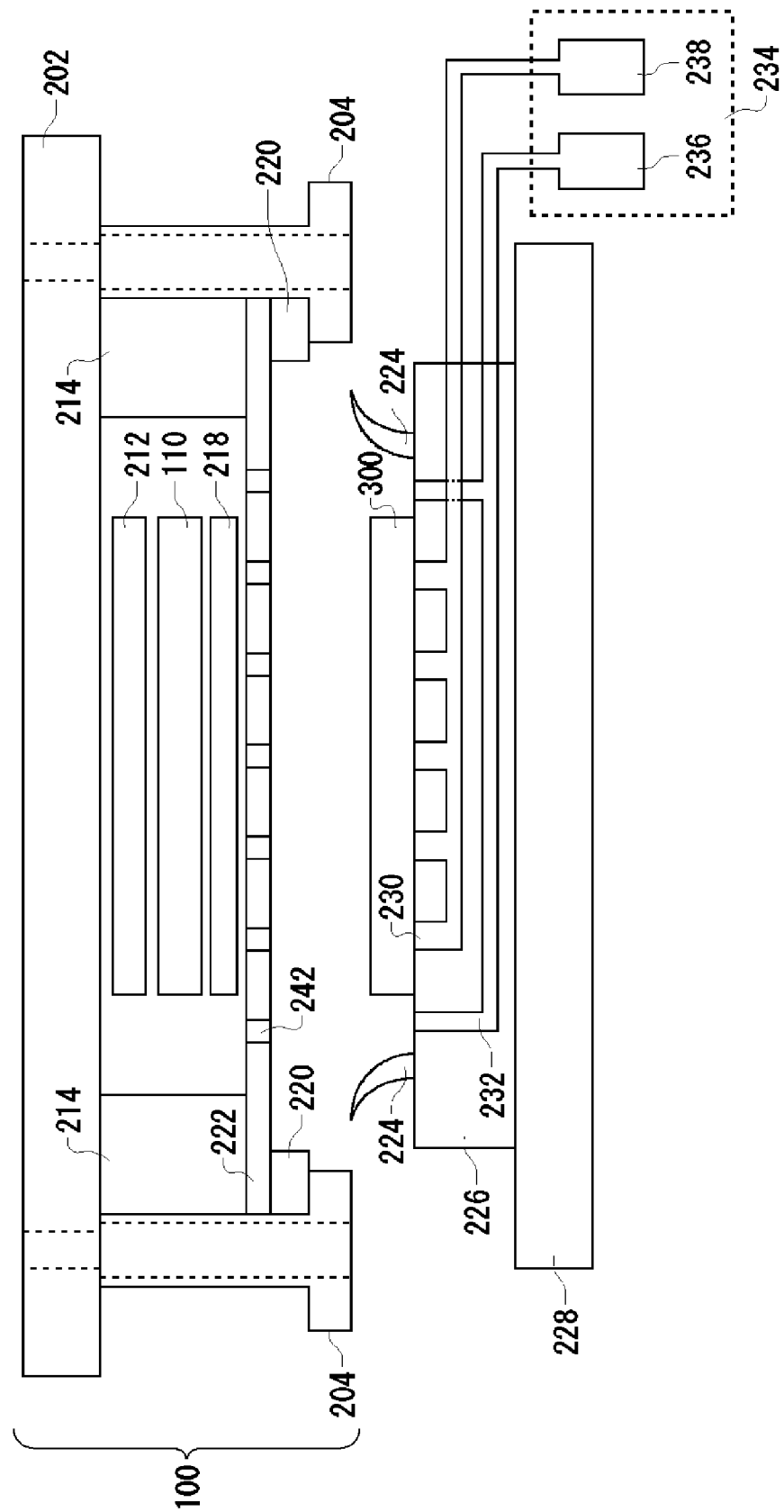
FIG. 7 is a sectional view of an exemplary configuration of a probe apparatus 200 provided in a chamber 20 of a test system 400.

FIG. 7 is a sectional view of an exemplary configuration of a probe apparatus 200 provided in a chamber 20 of a test system 400. In the present example, the probe apparatus 200 is electrically connected to the wafer to be tested 300, as well as testing the wafer to be tested 300 by exchanging signals with the wafer to be tested 300, in response to the control signal from the control apparatus 10.

The probe apparatus 200 includes a wafer unit for testing 100, a wafer sealing section 224, a wafer tray 226, a wafer stage 228, and a decompressing section 234. The wafer unit for testing 100 includes a connecting wafer 110, a wire substrate 202, a support 204, an apparatus anisotropic conductive sheet 212, an apparatus sealing section 214, a wafer anisotropic conductive sheet 218, a membrane 222, and a fixing ring 220.

In the present example, the wafer to be tested 300 may be a semiconductor substrate shaped as a disk. More specifically, the wafer to be tested 300 may be a substrate made of silicon, compound semiconductor, or other semiconductors. The wafer to be tested 300 is mounted on the wafer tray 226 of the probe apparatus 200. The wafer to be tested 300 may include a plurality of pads on its surface.

The wire substrate 202 is a substrate formed by a printed circuit board on which wiring or terminals are formed. The lower surface of the wire substrate 202 is provided with a plurality of terminals. The connecting wafer 110 may be a semiconductor substrate corresponding in shape to the wafer to be tested 300. The connecting wafer 110 is provided between the wire substrate 202 and the wafer to be tested 300, to face the wafer to be tested 300. When the wafer to be tested 300 is a semiconductor substrate shaped as a disk, the connecting wafer 110 may be a semiconductor substrate shaped as a circle, a semicircle, or a sector having a diameter substantially the same as or larger than the diameter of the wafer to be tested 300. Note that the shape of the connecting wafer 110 is not limited to the above-mentioned shapes, as long as it can face at least a part of the upper surface of the wafer to be tested 300.

Pads are provided on the upper surface of the connecting wafer 110 (i.e., on the surface of the connecting wafer 110 nearer the wire substrate 202), in position corresponding to the plurality of terminals of the wire substrate 202. Terminals (hereinafter occasionally referred to as "terminals for wafer to be tested") are provided on the lower surface of the connecting wafer 110 (i.e., on the surface of the connecting wafer 110 nearer the wafer to be tested 300), in position corresponding to the pads provided on the upper surface of the wafer to be tested 300. Instead, if terminals are provided on the upper surface of the wafer to be tested 300, pads, and not the terminals, should be provided on the lower surface of the connecting wafer 110.

The apparatus anisotropic conductive sheet 212 is provided between the wire substrate 202 and the connecting wafer 110. The apparatus anisotropic conductive sheet 212 is formed by a sheet material having conductive characteristic at a portion pressed by a predetermined pressure or more, for example. The apparatus anisotropic conductive sheet 212 is pressed by the terminals provided on the wire substrate 202 and the pads provided on the surface of the connecting wafer 110 nearer the wire substrate 202, to electrically connect the terminals to the pads.

The wafer anisotropic conductive sheet 218 is provided lower than the connecting wafer 110. The wafer anisotropic conductive sheet 218 is formed by a sheet material having conductive characteristic at a portion pressed by a predetermined pressure or more, for example. The wafer anisotropic conductive sheet 218 is pressed by the terminals provided on the connecting wafer 110 nearer the wafer to be tested 300 and the bump pads provided on the membrane 222 detailed later, to electrically connect the terminals to the pads.

The membrane 222 is a semiconductor substrate shaped as a disk having a diameter larger than the diameter of the connecting wafer 110 for example, and is provided between the wafer anisotropic conductive sheet 218 and the wafer to be tested 300. The membrane 222 may include the bump pads to electrically connect the wafer-side terminals of the connecting wafer 110 to the pads of the wafer to be tested 300. Penetrating holes 242 are provided through the membrane 222, in the direction from the wafer anisotropic conductive sheet 218 towards the wafer to be tested 300.

The fixing ring 220 is an elastic member shaped as a ring for example, and is provided along a periphery of the lower surface of the membrane 222. The outer diameter of the fixing ring 220 may be substantially equal to the outer diameter of the membrane 222, and the inner diameter of the fixing ring 220 may be larger than the diameter of the wafer sealing section 224 and of the wafer to be tested 300.

The support 204 is fixed to a frame of the probe apparatus 200 or the like, to retain the fixing ring 220, the membrane 222, and the wire substrate 202. As a result, the apparatus anisotropic conductive sheet 212, the connecting wafer 110, and the wafer anisotropic conductive sheet 218 are retained at a predetermined position, together with the membrane 222 and the wire substrate 202.

The apparatus sealing section 214 is an elastic member shaped as a ring for example, and is provided between the wire substrate 202 and the membrane 222, to surround the connecting wafer 110.

The wafer sealing section 224 is an elastic member shaped as a ring for example, and is provided to surround the outer circumference of the wafer to be tested 300 on the upper surface of the wafer tray 226. An end of the wafer sealing section 224 is fixed to the upper surface of the wafer tray 226, and the other end of the wafer sealing section 224 is formed in a "lip"-like formation such that the diameter of the annular formation enlarges as the distance from the upper surface of the wafer tray 226 increases. When the wafer tray 226 is pressed against the membrane 222, the other end of the wafer sealing section 224 is brought into contact with the lower surface of the membrane 222 to bend.

The wafer stage 228 retains the wafer tray 226. The wafer stage 228 can at least move the wafer tray 226 into a vertical direction (i.e., the direction to approach or is distanced from the wire substrate 202).

The decompressing section 234 includes a decompressor 236 and a decompressor 238. The decompressor 236 is connected to an air inlet path 232 for a hermetically sealed space having an opening on a portion of the upper surface of the wafer tray 226 on which the wafer to be tested 300 is not mounted. The decompressor 238 for a semiconductor wafer is connected to an air inlet path 230 for a semiconductor wafer having an opening on a portion of the upper surface of the wafer tray 226 on which the wafer to be tested 300 is mounted.

When the probe apparatus 200 having the configuration tests a wafer to be tested 300 mounted on the wafer tray 226, the wafer stage 228 first moves the wafer tray 226 in the direction of the membrane 222, to bring the upper end of the wafer sealing section 224 in tight contact with the membrane 222. By doing it, around the connecting wafer 110 and the wafer to be tested 300, a hermetically sealed space is created by means of the wire substrate 202, the wafer tray 226, the apparatus sealing section 214, the membrane 222, and the wafer sealing section 224.

Here, the membrane 222 is provided in the middle of the hermetically sealed space. However, the penetrating holes 242 provided through the membrane 222 as mentioned above help create the hermetically sealed space to be an integrated space.

The decompressor 236 decompresses the hermetically sealed space, by intaking the air through the air inlet path 232 for the hermetically sealed space. Again, as explained above, the penetrating holes 242 are provided through the membrane 222, which helps efficiently decompress the hermetically sealed space including both of the space created between the membrane 222 and the wire substrate 202 and the space created between the membrane 222 and the wafer tray 226

As the decompressor 236 decompresses the hermetically sealed space, the wafer unit for testing 100 and the wafer tray 226 are pressed against each other, to press the wafer to be tested 300 onto the membrane 222. Then the wire substrate 202 moves as the membrane 222 compresses the apparatus sealing section 214, to retain the wire substrate 202, the apparatus anisotropic conductive sheet 212, the connecting wafer 110, and the wafer anisotropic conductive sheet 218 to about each other.

Accordingly, the terminals provided on the lower surface of the wire substrate 202 are electrically connected to the pads provided on the upper surface of the connecting wafer 110, via the apparatus anisotropic conductive sheet 212. Moreover, the terminals provided on the lower surface of the connecting wafer 110 are electrically connected to the pads provided on the upper surface of the wafer to be tested 300, via the bump pads of the membrane 222 and the wafer anisotropic conductive sheet 218.

The decompressor 238 may intake an air through the air inlet path 230 for semiconductor wafer at substantially the same timing as the air intaking operation performed by the decompressor 236. Accordingly, the wafer to be tested 300 is attached by suction to the wafer tray 226.

Accordingly, in decompression or recovery of the pressure of the hermetically sealed space, the wafer to be tested 300 is prevented from being moved on the wafer tray 226 or removed from the wafer tray 226. The probe apparatus 200 conducts a test of the wafer to be tested 300, in the state where the decompression has been completed by means of the decompressor 236 and the decompressor 238.

Figure 8:
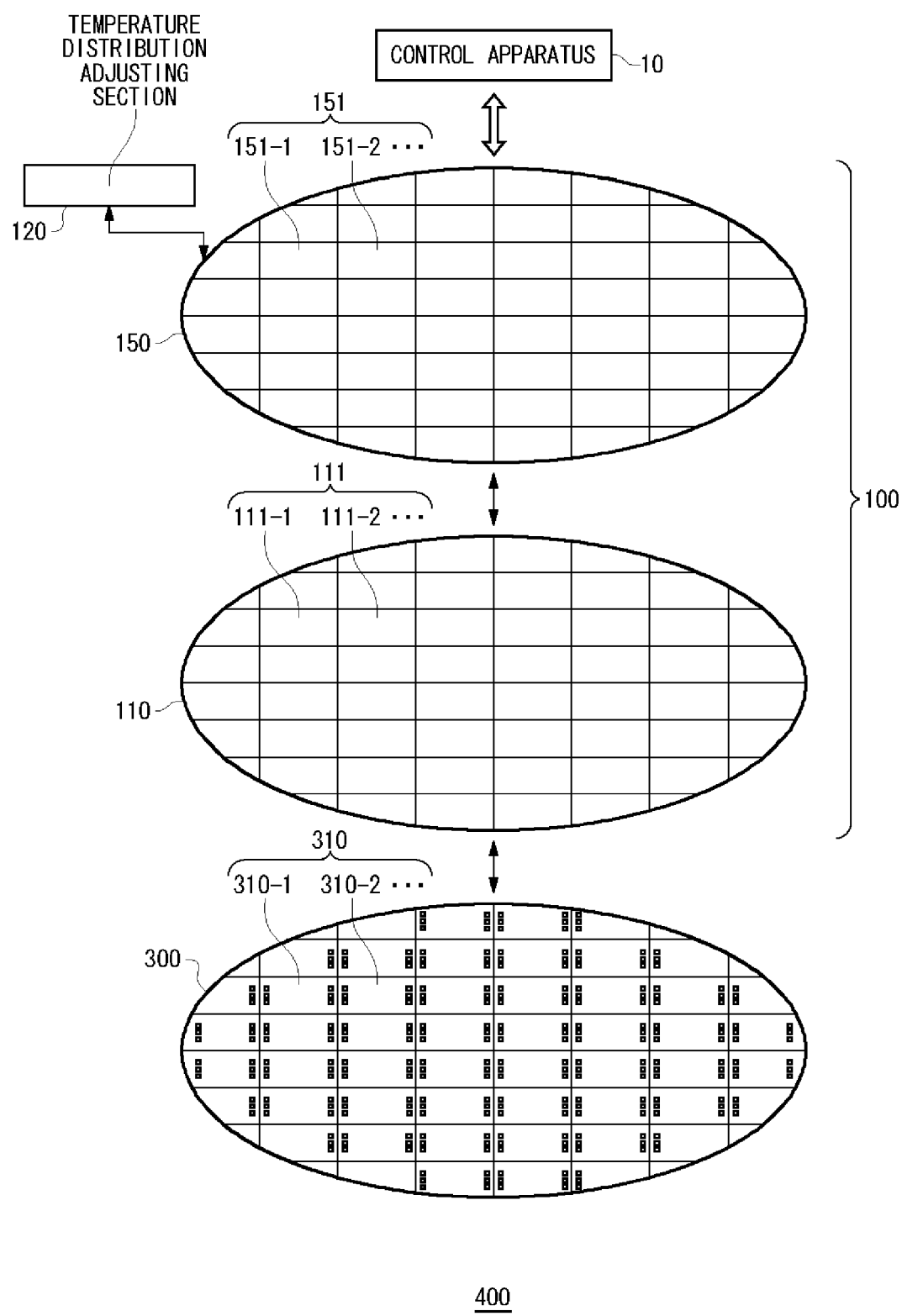
FIG. 8 shows an overview of another exemplary configuration of a test system 400.

FIG. 8 shows an overview of another exemplary configuration of a test system 400. In the present example, the same configuration as that of FIG. 2 or the like is assigned the same reference numeral, and only a partial explanation is provided thereto.

The wafer unit for testing 100 of FIG. 8 includes a connecting wafer 110, a circuit wafer 150, and a temperature distribution adjusting section 120. The circuit wafer 150 is provided to face the connecting wafer 110. The circuit wafer 150 includes a plurality of unit cells 151 (151-1, 151-2, . . . ) provided in position corresponding to the plurality of unit cells 111 (111-1, 111-2, . . . ) of the connecting wafer 110. When the wafer unit for testing 100 and the wafer to be tested 300 are electrically connected to each other in the probe apparatus 200 as explained above, the circuit wafer 150 is brought to electrical connection with the wafer to be tested 300 via the connecting wafer 110.

The control apparatus 10 may test each chip to be tested 310 by supplying a test signal to the chip to be tested 310 of the wafer to be tested 300 via the circuit wafer 150 and the connecting wafer 110. The control apparatus 10 may also receive, via the connecting wafer 110 and the circuit wafer 150, a response signal that each chip to be tested 310 outputs in response to a test signal, and judge pass/fail of the chip to be tested 310.

Figure 9:
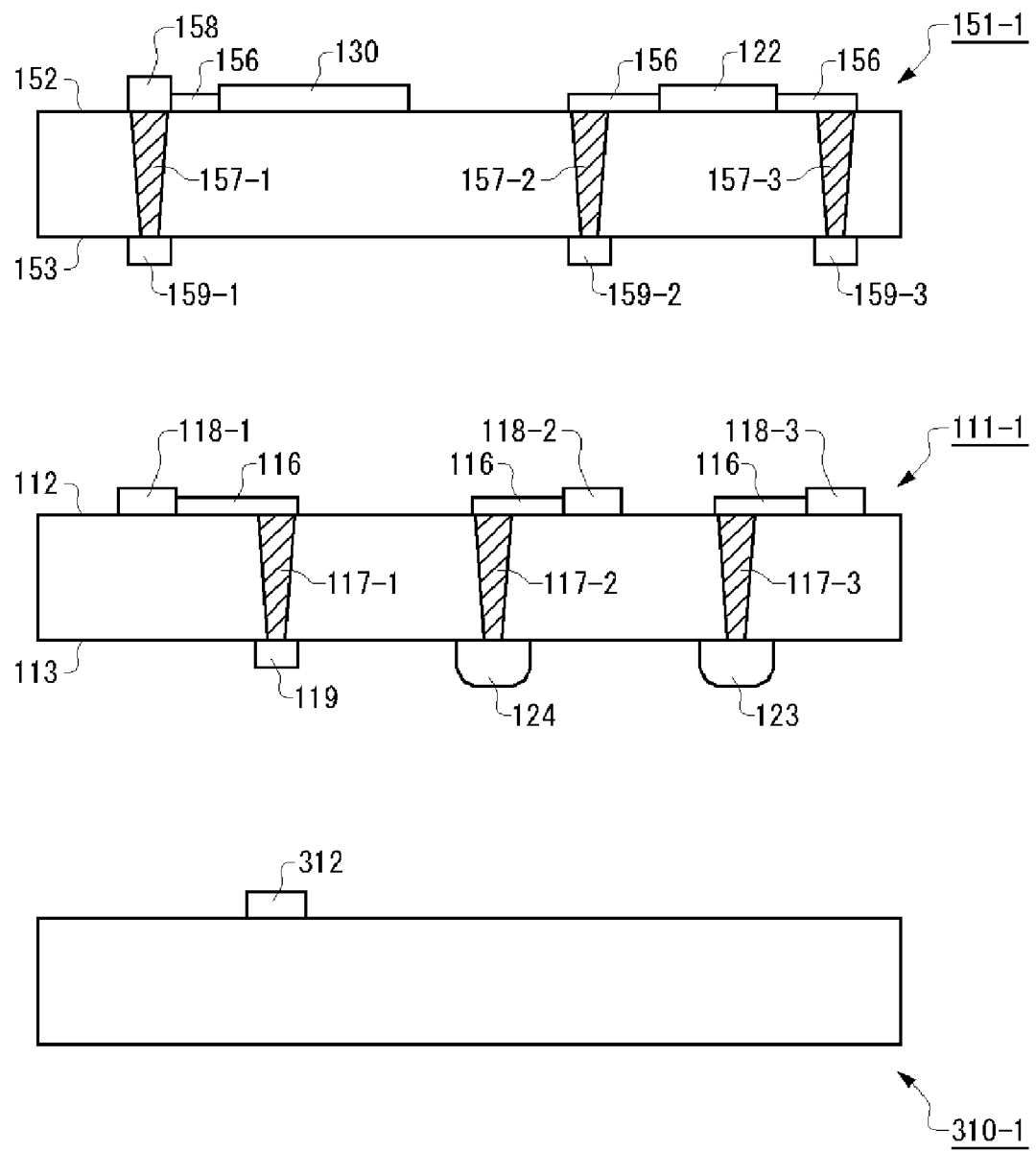
FIG. 9 is an exemplary sectional view of a unit cell 151-1 of a circuit wafer 150, a unit cell 111-1 of a connecting wafer 110 and a chip to be tested 310-1 of a wafer to be tested 300.

FIG. 9 is an exemplary sectional view of a unit cell 151-1 of a circuit wafer 150, a unit cell 111-1 of a connecting wafer 110 and a chip to be tested 310-1 of a wafer to be tested 300. FIG. 9 only shows the unit cell 151-1 of the circuit wafer 150 and the unit cell 111-1 of the connecting wafer 110 that are provided to face each other, and a chip to be tested 310-1 of the wafer to be tested 300. In FIG. 9, the same configuration as that of FIG. 3 through FIG. 5 or the like is assigned the same reference numeral, and only a partial explanation is provided thereto.

The control circuit 122 and the test circuit 130 are provided on a surface (hereinafter referred to as "upper surface 152 of the unit cell 151-1") of the unit cell 151-1 that faces away from the unit cell 111-1. In addition, the heater 123 and the temperature sensor 124 are provided on the lower surface 113 of the unit cell 111-1 (i.e., a surface of the unit cell 111-1 that faces away from the unit cell 151-1).

Apparatus pads 158 are provided on the upper surface 152 of the unit cell 151-1. Moreover, on the lower surface 153 of the unit cell 151-1, connecting wafer pads 159 (159-1, 159-2, 159-3) are provided in position corresponding to the plurality of circuit wafer pads 118 (118-1, 118-2, 118-3) provided on the upper surface 112 of the unit cell 111-1. A pad for wafer to be tested 119 is provided on the lower surface 113 of the unit cell 111-1, in a position corresponding to the terminal 312 provided on the upper surface of the chip to be tested 310-1.

A plurality of vias 157 (157-1, 157-2, 157-3) are provided through the unit cell 151-1 from the upper surface 152 to the lower surface 153. A plurality of vias 117 (117-1, 117-2, 117-3) are provided through the unit cell 111-1 from the upper surface 112 to the lower surface 113.

When testing the wafer to be tested 300, the pad for wafer to be tested 119 comes near to the terminal 312. Moreover, the tip of the heater 123 and the tip of the temperature sensor 124 come near the upper surface of the chip to be tested 310-1. The plurality of connecting wafer pads 159 come near the circuit wafer pads 118 respectively, such that the wafer pad 159-1 comes near the circuit wafer pad 118-1, etc.

The control circuit 122 is electrically connected to the heater 123, via the pattern wire 156, the via 157-3, the connecting wafer pad 159-1, the circuit wafer pad 118-1, the pattern wire 116, and the via 117-3. The control circuit 122 is also electrically connected to the temperature sensor 124, via the pattern wire 156, the via 157-2, the connecting wafer pad 159-2, the circuit wafer pad 118-2, the pattern wire 116, and the via 117-2.

The test circuit 130 is electrically connected to the terminal 312 of the chip to be tested 310-1, via the pattern wire 156, the via 157-1, the connecting wafer pad 159-1, the circuit wafer pad 118-1, the pattern wire 116, and the via 117-1.

The test system 400 tests each chip to be tested 310 of the wafer to be tested 300, in the state that each unit cell 151 of the circuit wafer 150, each unit cell 111 of the connecting wafer 110, and each chip to be tested 310 of the wafer to be tested 300 are electrically connected to the unit cell 151-1, the unit cell 111-1, and the chip to be tested 310-1 in the similar manner. During the test, the surface temperature of each chip to be tested 310-1 is detected, and the heater 123 is controlled based on the detection result. The specific process of the detection of the surface temperature and the control of the heater 123 is the same as the specific process explained above with reference to FIG. 3, and so is not further detailed in the following.

In the present example, the wafer unit for testing 100 includes a connecting wafer 110 and a circuit wafer 150 provided next to the connecting wafer 110 to farther away from the wafer to be tested 300. Moreover, a heater 123 is provided on a surface of the connecting wafer 110 that faces the wafer to be tested 300, and a control circuit 122 and a test circuit 130 are provided on a surface of the circuit wafer 150 that is farther from the wafer to be tested 300. Accordingly, the control circuit 122 and the test circuit 130 are hardly subjected to the effect from heat dissipation from the heater 123.

Figure 10:
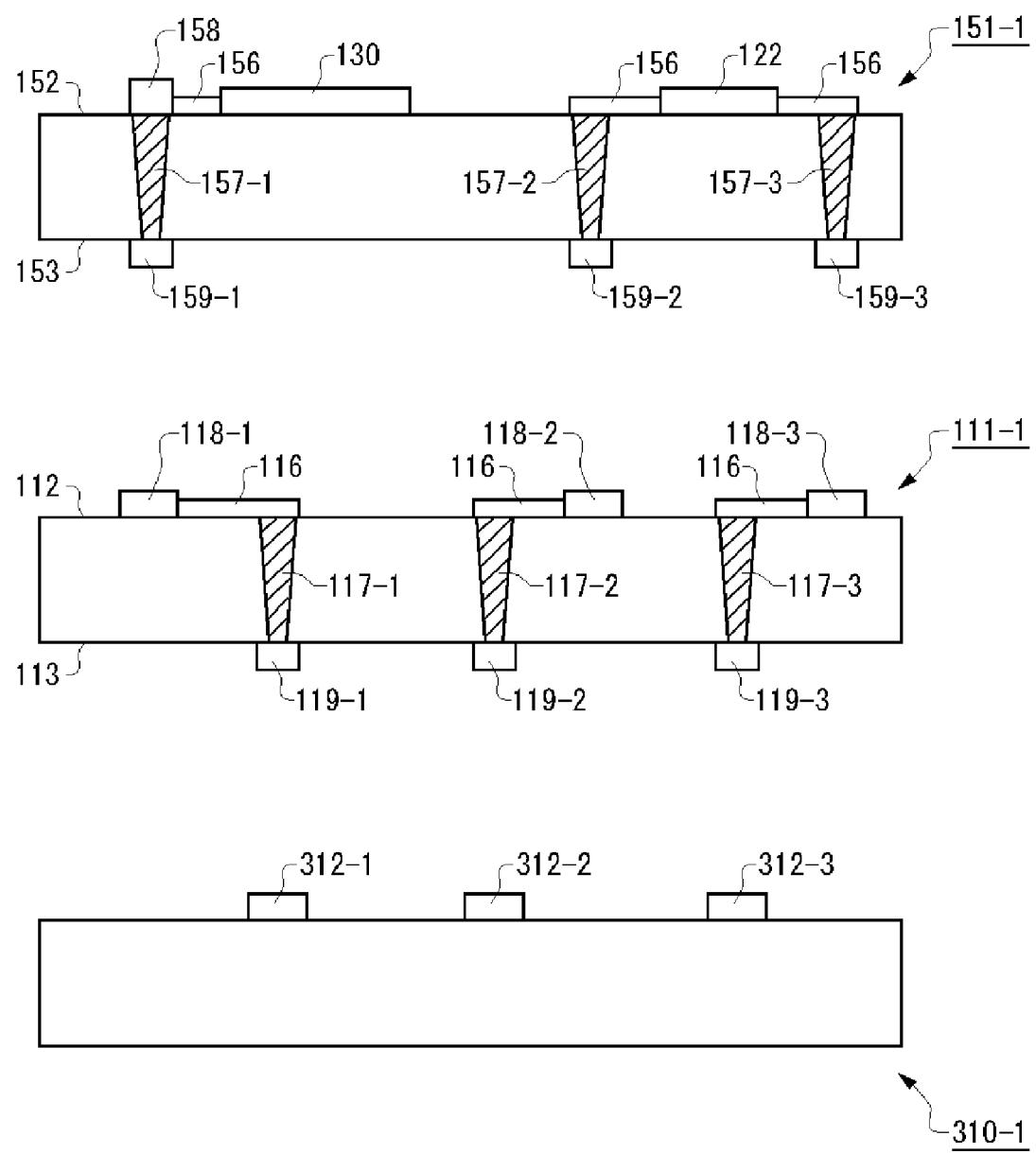
FIG. 10 is another exemplary sectional view of a unit cell 151-1, a unit cell 111-1, and a chip to be tested 310-1.

FIG. 10 is another exemplary sectional view of a unit cell 151-1, a unit cell 111-1, and a chip to be tested 310-1. In FIG. 10, the same configuration as that of FIG. 3 through FIG. 5, and FIG. 9 or the like is assigned the same reference numeral, and only a partial explanation is provided thereto.

In the present example, a plurality of terminals 312 (312-1, 312-2, and 312-3) are provided on the upper surface of the chip to be tested 310-1 of the wafer to be tested 300. In addition, a plurality of connecting wafer pads 159 (159-1, 159-2, 159-3) are provided on the lower surface 153 of the unit cell 151-1 of the circuit wafer 150 at a pitch different from the pitch of the plurality of terminals 312 (312-1, 312-2, 312-3).

On the other hand, circuit wafer pads 118 (118-1, 118-2, 118-3) are provided on the upper surface of the unit cell 111-1 of the connecting wafer 110 in position corresponding to the plurality of connecting wafer pads 159 (159-1, 159-2, 159-3). A plurality of pads for wafer to be tested 119 (119-1, 119-2, 119-3) are provided on the lower surface 113 of the unit cell 111-1 in position corresponding to the plurality of terminals 312 (312-1, 312-2, 312-3).

In the unit cell 111-1, each circuit wafer pad 118 is electrically connected to the corresponding pad for wafer to be tested 119-1. For example, the circuit wafer pad 118-1 is electrically connected to the pad for wafer to be tested 119-1 via the pattern wire 116 and the via 117-1.

In this way, even when the pitch of the pads of the circuit wafer 150, to which the control circuit 122 and the test circuit 130 are provided, is different from the pitch of the terminals of the wafer to be tested 300, the connecting wafer 110 can be provided to transform these pitches, thereby electrically connecting the pads and the terminals for the circuit wafer 150 and the wafer to be tested 300. Also by using the connecting wafer 110 to transform these pitches as in this example, it becomes unnecessary to provide the circuit wafer 150 for each wafer to be tested 300 whose formation of terminals is different from one another, and so a single circuit wafer 150 can be used more universally.

Figure 11:
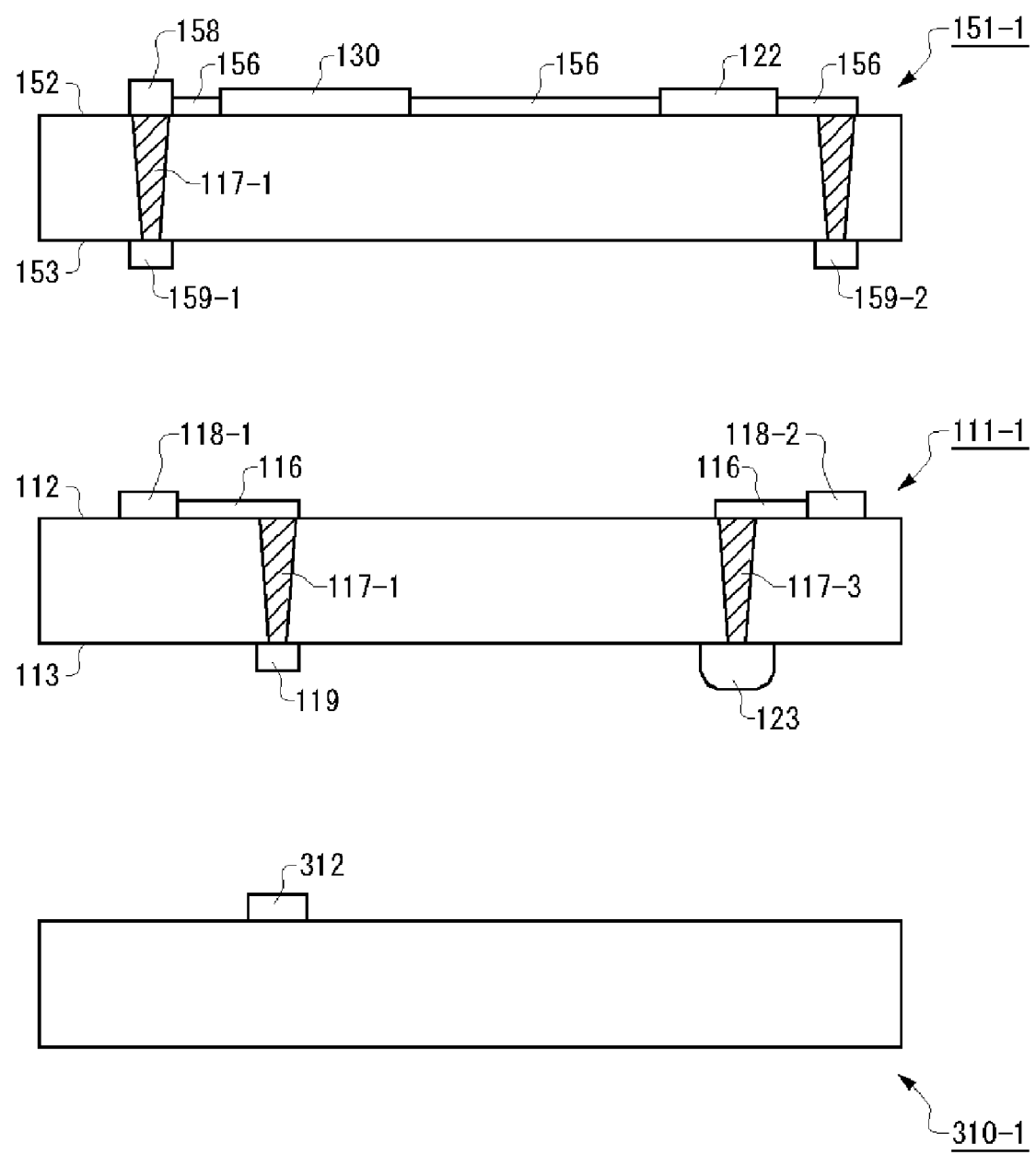
FIG. 11 is another exemplary sectional view of a unit cell 151-1, a unit cell 111-1, and a chip to be tested 310-1.

FIG. 11 is another exemplary sectional view of a unit cell 151-1, a unit cell 111-1, and a chip to be tested 310-1. In FIG. 11, the same configuration as that of FIG. 3 through FIG. 5, FIG. 9, and FIG. 10 or the like is assigned the same reference numeral, and only a partial explanation is provided thereto.

In the present example, in contrast to the configuration explained above with reference to FIG. 9, there are no temperature sensor 124, or pattern wire, pads, vias, or the like for electrically connecting the temperature sensor 124 to the control circuit 122. Additionally in the present example, the control circuit 122 is electrically connected to the test circuit 130 via the pattern wire 156.

In the present example, the control circuit 122 detects the consumption current of the chip to be tested 310-1 during a test, based on the value of the current flowing through the test circuit 130. The control circuit 122 controls the heater 123 based on the size of the detected consumption current. The specific process of the detection and the control is the same as the specific process explained above with reference to FIG. 4, and so is not further detailed in the following.

In the present example, the connecting wafer pads 159 of the unit cell 151-1 do not correspond in position to the terminal(s) 312 of the chips to be tested 310-1. Therefore, when the circuit wafer 150 and the wafer to be tested 300 are brought to be near each other, by corresponding the unit cells 151 to the chips to be tested 310 in position, the connecting wafer pads 159 cannot be directly connected to the terminal(s) 312. However, even these connecting wafer pads 159 and the terminal(s) 312 can be electrically connected to each other, by providing, between the circuit wafer 150 and the wafer to be tested 300, the connecting wafer 110 for connecting the pads and terminals that do not correspond each other in position.

Figure 12:
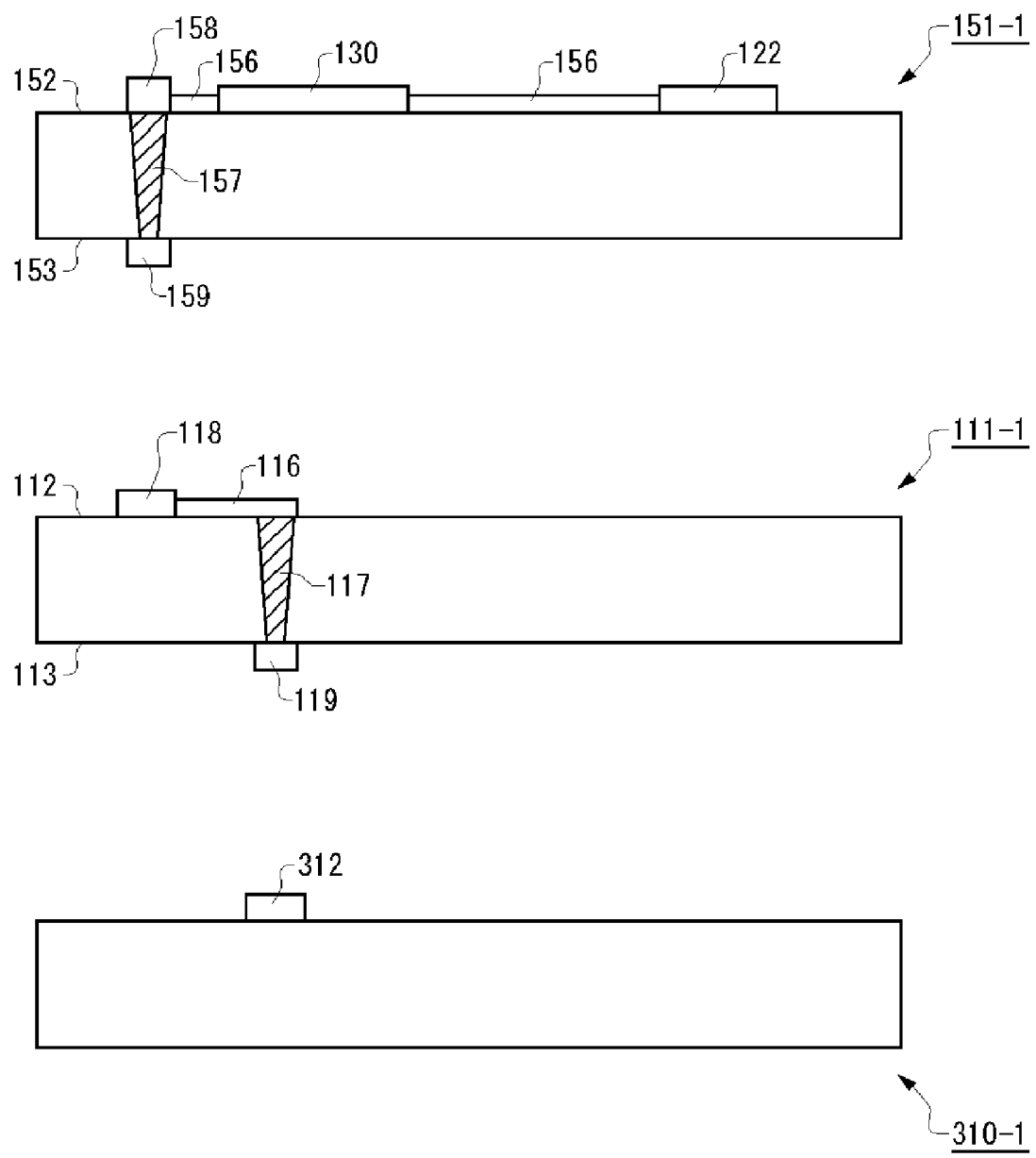
FIG. 12 is another exemplary sectional view of a unit cell 151-1, a unit cell 111-1, and a chip to be tested 310-1.

FIG. 12 is another exemplary sectional view of a unit cell 151-1, a unit cell 111-1, and a chip to be tested 310-1. In FIG. 12, the same configuration as that of FIG. 3 through FIG. 5, FIG. 9 through FIG. 11 or the like is assigned the same reference numeral, and only a partial explanation is provided thereto.

In the present example, in contrast to the configuration explained above with reference to FIG. 11, there are no heater 123, or pattern wire, pads, vias, or the like for electrically connecting the heater 123 to the control circuit 122.

In the present example, the control circuit 122 detects the consumption current of the chip to be tested 310-1 during a test, based on the value of the current flowing through the test circuit 130. The control circuit 122 controls the current to be supplied to the chip to be tested 310, based on the size of the detected consumption current. The specific process of the detection and the adjustment is the same as the specific process explained above with reference to FIG. 5, and so is not further detailed in the following.

In the present example, just as in the configuration explained above with reference to FIG. 11, these connecting wafer pads 159 and the terminals 312 can be electrically connected to each other, by providing, between the circuit wafer 150 and the wafer to be tested 300, the connecting wafer 110 for connecting the pads and terminals that do not correspond each other in position.

Figure 13:
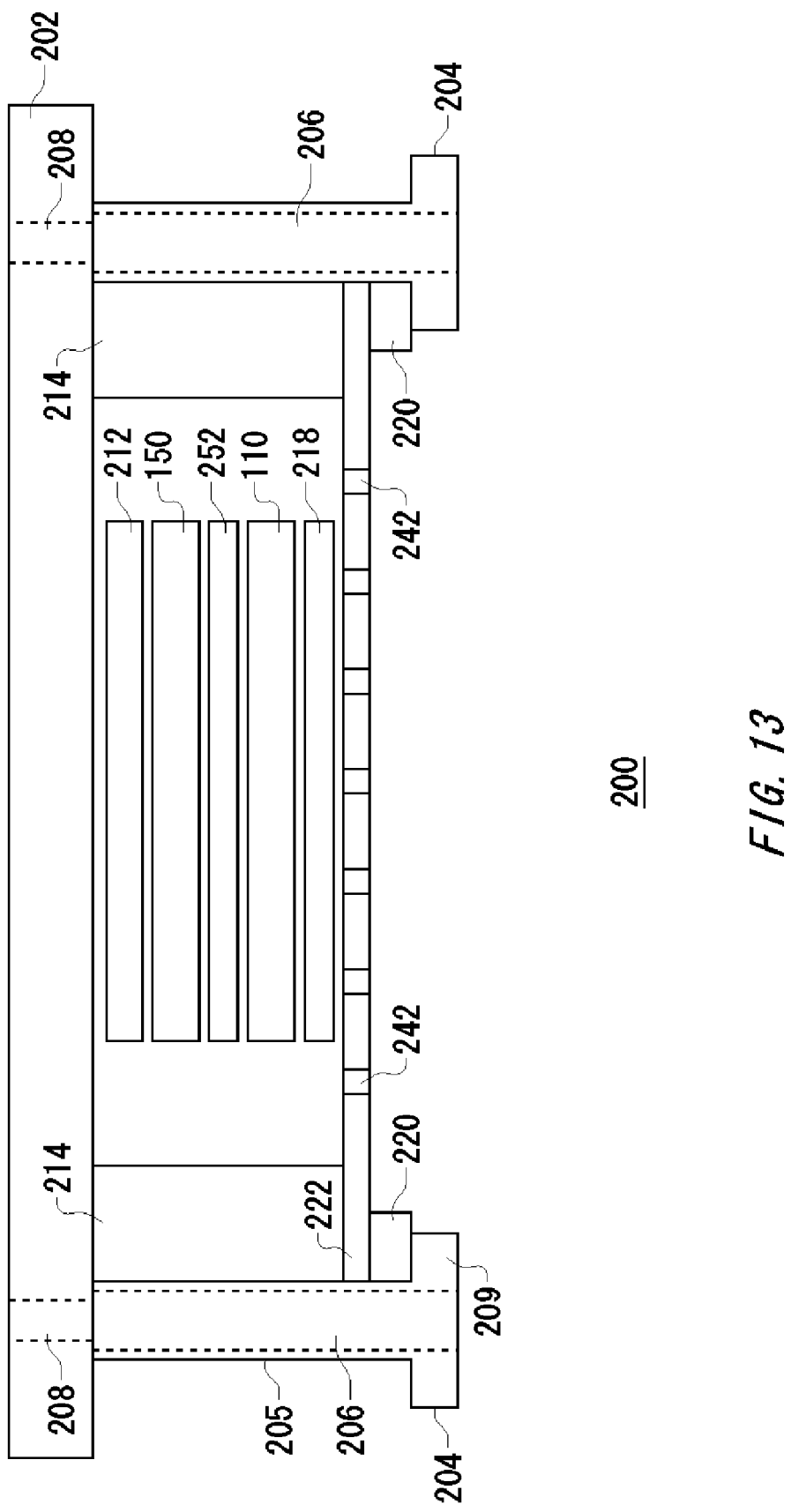
FIG. 13 is a sectional view of another exemplary configuration of a probe apparatus 200 provided in a chamber 20 of a test system 400.

FIG. 13 is a sectional view of another exemplary configuration of a probe apparatus 200 provided in a chamber 20 of a test system 400. In the present example, the probe apparatus 200 is electrically connected to the wafer to be tested 300, as well as testing the wafer to be tested 300 by exchanging signals with the wafer to be tested 300, in response to the control signal from the control apparatus 10.

The probe apparatus 200 includes a wafer unit for testing 100, a wafer sealing section 224, a wafer tray 226, a wafer stage 228, and a decompressing section 234. The wafer unit for testing 100 includes a connecting wafer 110, a wire substrate 202, a support 204, an apparatus anisotropic conductive sheet 212, an apparatus sealing section 214, a wafer anisotropic conductive sheet 218, a membrane 222, and a fixing ring 220.

FIG. 13 is a sectional view of an exemplary configuration of a probe apparatus 200, when using the connecting wafer 110 and the circuit wafer 150. Note that the configuration of the probe apparatus 200 towards the wafer to be tested 300 is the same as the configuration explained above with reference to FIG. 7, and so is not explained in the following.

The apparatus anisotropic conductive sheet 212 is provided on the upper surface of the circuit wafer 150, in the same manner as explained above for the connecting wafer 110 with reference to FIG. 2 through FIG. 7. In addition, the wafer anisotropic conductive sheet 218 is provided on the lower surface of the connecting wafer 110 in the same manner as explained above for the connecting wafer 110 with reference to FIG. 2 through FIG. 7.

In the probe apparatus 200 of the present example, an additional anisotropic conductive sheet 252 is provided between the connecting wafer 110 and the circuit wafer 150. These configurations are provided in the space created between the wire substrate 202 and the membrane 222. The concrete operation to test the wafer to be tested 300 using the probe apparatus 200 of the present example is similar to the operation of the probe apparatus 200 explained above with reference to FIG. 7, and so is not explained in this specification.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A wafer unit for testing that is electrically connected to a plurality of chips to be tested formed on a wafer to be tested, the wafer unit for testing comprising:
   a connecting wafer provided to face the wafer to be tested, the connecting wafer including a plurality of test pads for sending or receiving test signals to or from the wafer to be tested, each test pad adapted to be electrically connected to a corresponding one of the plurality of chips to be tested;
   a temperature distribution adjusting section adapted to adjust a temperature distribution of the wafer to be tested, the temperature distribution adjusting section including a plurality of individual temperature adjusting sections, each of the individual temperature adjusting sections including a heater adapted to heat a corresponding one of the plurality of chips to be tested; and
   a plurality of test circuits adapted to test a corresponding one of the plurality of chips to be tested, via a corresponding one of the plurality of test pads, wherein
   the plurality of test pads and the plurality of heaters are provided on a surface of the connecting wafer that faces the wafer to be tested, and
   each of the individual temperature adjusting sections is adapted to control its heater based on a current flowing through a corresponding one of the plurality of test circuits.

2. The wafer unit for testing according to claim 1, wherein the connecting wafer corresponds, in shape, to the wafer to be tested.

3. The wafer unit for testing according to claim 2, wherein each individual temperature adjusting section detects information corresponding to power consumption of the chip that the individual temperature adjusting section's heater is adapted to heat, to adjust the temperature of the chip based on a result of the detection.

4. The wafer unit for testing according to claim 1, further comprising:
   a circuit wafer provided to face the connecting wafer, and to be electrically connected via the connecting wafer to the wafer to be tested, wherein
   the plurality of test circuits are provided on the circuit wafer to correspond to the plurality of chips to be tested.

5. The wafer unit for testing according to claim 4, wherein each of the individual temperature adjusting sections includes a control circuit, provided on the circuit wafer, corresponding to a corresponding one of the plurality of chips to be tested and adapted to control the individual temperature adjusting section's heater based on a result of detecting a power source current supplied to the corresponding one of the plurality of chips to be tested.

6. The wafer unit for testing according to claim 4, wherein the plurality of test circuits are provided on a surface of the circuit wafer that faces away from the connecting wafer.

7. The wafer unit for testing according to claim 6, wherein a plurality of circuit wafer pads are provided on a surface of the connecting wafer that faces the circuit wafer, each circuit wafer pad to be electrically connected to a corresponding one of the plurality of test circuits.

8. The wafer unit for testing according to claim 7, wherein an interval for the plurality of test pads is different from an interval for the plurality of circuit wafer pads.

9. The wafer unit for testing according to claim 1, wherein each of the individual temperature adjusting sections includes a temperature sensor provided on the surface of the connecting wafer that faces the wafer to be tested, each temperature sensor adapted to measure surface temperature of a corresponding one of the plurality of chips to be tested, and
   each of the individual temperature adjusting sections is adapted to control its heater based on the measurement of the individual temperature adjusting section's temperature sensor.

10. The wafer unit for testing according to claim 1, wherein the plurality of test circuits are provided on a surface of the connecting wafer that faces away from the wafer to be tested.

11. The wafer unit for testing according to claim 10, wherein
   each of the individual temperature adjusting sections includes a control circuit, provided on the surface of the connecting wafer that faces away from the wafer to be tested, corresponding to a corresponding one of the plurality of chips to be tested and adapted to control the individual temperature adjusting section's heater based on a current flowing through a corresponding one of the plurality of test circuits.

12. A test system for testing a plurality of chips to be tested formed on a wafer to be tested, the test system comprising:
- a wafer unit for testing that is electrically connected to the plurality of chips to be tested; and
- a control apparatus that tests each of the plurality of chips to be tested via the wafer unit for testing, wherein the wafer unit for testing includes:
- a connecting wafer provided to face the wafer to be tested, the connecting wafer including a plurality of test pads for sending or receiving test signals to or from the wafer to be tested, each test pad adapted to be electrically connected to a corresponding one of the plurality of chips to be tested;
- a temperature distribution adjusting section adapted to adjust a temperature distribution of the wafer to be tested, the temperature distribution adjusting section including a plurality of individual temperature adjusting sections, each of the individual temperature adjusting sections including a heater adapted to heat a corresponding one of the plurality of chips to be tested; and
- a plurality of test circuits adapted to test a corresponding one of the plurality of chips to be tested, via a corresponding one of the plurality of test pads, the plurality of test pads and the plurality of heaters are provided on a surface of the connecting wafer that faces the wafer to be tested, and each of the individual temperature adjusting sections is adapted to control its heater based on a current flowing through a corresponding one of the plurality of test circuits.

13. The test system according to claim 12, wherein the connecting wafer corresponds, in shape, to the wafer to be tested.

14. The test system according to claim 13, wherein each individual temperature adjusting section detects information corresponding to power consumption of the chip that the individual temperature adjusting section's heater is adapted to heat, to adjust the temperature of the chip based on a result of the detection.

15. The test system according to claim 12, further comprising:
- a circuit wafer provided to face the connecting wafer, and to be electrically connected via the connecting wafer to the wafer to be tested, wherein the plurality of test circuits are provided on the circuit wafer to correspond to the plurality of chips to be tested.

16. The test system according to claim 15, wherein each of the individual temperature adjusting sections includes a control circuit, provided on the circuit wafer, corresponding to a corresponding one of the plurality of chips to be tested and adapted to control the individual temperature adjusting section's heater based on a result of detecting a power source current supplied to the corresponding one of the plurality of chips to be tested.

17. The test system according to claim 15, wherein the plurality of test circuits are provided on a surface of the circuit wafer that faces away from the connecting wafer.

18. The test system according to claim 17, wherein a plurality of circuit wafer pads are provided on a surface of the connecting wafer that faces the circuit wafer, each circuit wafer pad to be electrically connected to a corresponding one of the plurality of test circuits.

19. The test system according to claim 18, wherein an interval for the plurality of test pads is different from an interval for the plurality of circuit wafer pads.

20. The test system according to claim 12, wherein each of the individual temperature adjusting sections includes a temperature sensor provided on the surface of the connecting wafer that faces the wafer to be tested, each temperature sensor adapted to measure surface temperature of a corresponding one of the plurality of chips to be tested, and each of the individual temperature adjusting sections is adapted to control its heater based on the measurement of the individual temperature adjusting section's temperature sensor.

21. The test system according to claim 12, wherein the plurality of test circuits are provided on a surface of the connecting wafer that faces away from the wafer to be tested.

22. The test system according to claim 21, wherein each of the individual temperature adjusting sections includes a control circuit, provided on the surface of the connecting wafer that faces away from the wafer to be tested, corresponding to a corresponding one of the plurality of chips to be tested and adapted to control the individual temperature adjusting section's heater based on a current flowing through a corresponding one of the plurality of test circuits.

* * * * *